United States Patent
Dudeck et al.

(10) Patent No.: US 7,433,254 B2
(45) Date of Patent: Oct. 7, 2008

(54) ACCELERATED SINGLE-ENDED SENSING FOR A MEMORY CIRCUIT

(75) Inventors: Dennis E. Dudeck, Hazleton, PA (US); Donald Albert Evans, Lancaster, PA (US); Hai Quang Pham, Hatfield, PA (US); Wayne E. Werner, Coopersburg, PA (US); Ronald James Wozniak, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 272 days.

(21) Appl. No.: 11/460,035

(22) Filed: Jul. 26, 2006

(65) Prior Publication Data

US 2008/0025103 A1    Jan. 31, 2008

(51) Int. Cl.
*G11C 7/02* (2006.01)
(52) U.S. Cl. ............... 365/210.1; 365/210.12; 365/205; 365/207; 365/196
(58) Field of Classification Search .............. 365/210.1, 365/210.12, 205, 207, 196
See application file for complete search history.

(56) References Cited

U.S. PATENT DOCUMENTS

| | | | |
|---|---|---|---|
| 6,771,551 B1 * | 8/2004 | Terzioglu et al. ...... | 365/189.09 |
| 7,126,869 B1 * | 10/2006 | Chou ...................... | 365/207 |
| 7,200,041 B2 * | 4/2007 | Marotta et al. .......... | 365/185.2 |
| 2004/0169529 A1 * | 9/2004 | Afghahi et al. ........... | 327/51 |
| 2008/0025119 A1 * | 1/2008 | Dudeck et al. .......... | 365/207 |

* cited by examiner

*Primary Examiner*—Richard Elms
*Assistant Examiner*—Eric Wendler
(74) *Attorney, Agent, or Firm*—Ryan, Mason & Lewis, LLP

(57) ABSTRACT

A single-ended sensing circuit is provided for use with a memory circuit including a plurality of bit lines and a plurality of memory cells connected to the bit lines. The sensing circuit includes at least one charge sharing circuit and at least one switching circuit connected to the charge sharing circuit. The switching circuit is operative to selectively connect the charge sharing circuit to at least a given one of the bit lines as a function of a first control signal supplied to the switching circuit. The sensing circuit further includes at least one comparator circuit connected to the given bit line. The comparator circuit is operative to generate an output signal indicative of a logical state of a memory cell connected to the given bit line. The charge sharing circuit is operative to remove an amount of charge on the given bit line so as to reduce a voltage on the given bit line in conjunction with a read access of the memory cell.

22 Claims, 3 Drawing Sheets

US 7,433,254 B2

ACCELERATED SINGLE-ENDED SENSING FOR A MEMORY CIRCUIT

FIELD OF THE INVENTION

The present invention relates generally to sensing circuits, and more particularly relates to single-ended sensing in a memory circuit.

BACKGROUND OF THE INVENTION

Single-ended sensing techniques are used in various circuit applications involving both memory and logic, including, for example, read-only memory (ROM) and register file (REG-FILE) memory. In a typical memory circuit application, numerous memory cells (e.g., up to about 512) are connected to a common line, often referred to as a bit line. A memory circuit typically includes a plurality of bit lines and corresponding memory cells coupled thereto. As the number of memory cells connected to a given bit line in the memory circuit increases, the time for a single memory cell to charge and/or discharge the bit line increases accordingly. This is due primarily to the increased capacitance on the bit line attributable to the memory cells connected thereto.

In many cases, particularly single-ended sensing applications, the logical state of a selected memory cell in a memory circuit is sensed, for example during a read operation, by an inverter connected to a corresponding bit line associated with the selected memory cell. A local access time of the memory circuit is defined primarily by the time it takes for the voltage on the bit line to reach a switching point of the sensing inverter. Therefore, since it is desirable to minimize access time in the memory circuit, it is beneficial to reduce the time it takes for the voltage on the bit line to reach the switching point of the sensing inverter.

One known technique for reducing the time it takes for the voltage on the bit line to reach the switching point of the inverter is to employ larger memory cells having increased gain capable of more quickly driving (e.g., charging or discharging) the corresponding bit lines. However, using larger memory cells undesirably increases the area and the power consumed by the memory cell, and thereby increases the cost of the memory circuit. Access time of the memory circuit may also be reduced by using a differential sensing approach, wherein bit line pairs and corresponding differential sensing circuits are used to read the respective logic states of memory cells. However, the added size and complexity of a differential sensing arrangement renders such an approach undesirable compared to a single-ended sensing methodology.

Accordingly, there exists a need for an improved single-ended sensing arrangement for use in a memory circuit which does not suffer from one or more of the problems exhibited by conventional single-ended sensing methodologies.

SUMMARY OF THE INVENTION

The present invention meets the above-noted need by providing, in illustrative embodiments thereof, techniques for advantageously accelerating single-ended sensing in a memory circuit. The illustrative embodiments of the present invention advantageously exploit charge sharing principles which enable a read signal associated with a selected memory cell connected to a given bit line to attain a switching point of corresponding sensing circuitry connected to the bit line and thereby decrease an access time of the memory circuit.

In accordance with an aspect of the invention, a single-ended sensing circuit is provided for use with a memory circuit including a plurality of bit lines and a plurality of memory cells connected to the bit lines. The sensing circuit includes at least one charge sharing circuit and at least one switching circuit connected to the charge sharing circuit. The switching circuit is operative to selectively connect the charge sharing circuit to at least a given one of the bit lines as a function of a first control signal supplied to the switching circuit. The sensing circuit further includes at least one comparator circuit connected to the given bit line. The comparator circuit is operative to generate an output signal indicative of a logical state of a memory cell connected to the given bit line. The charge sharing circuit is operative to remove an amount of charge on the given bit line so as to reduce a voltage on the given bit line in conjunction with a read access of the memory cell.

In accordance with another embodiment of the invention, a memory circuit includes a plurality of bit lines, a plurality of memory cells connected to the bit lines, and at least one single-ended sensing circuit. The sensing circuit includes at least one charge sharing circuit and at least one switching circuit connected to the charge sharing circuit. The switching circuit is operative to selectively connect the charge sharing circuit to at least a given one of the bit lines as a function of a first control signal supplied to the switching circuit. The sensing circuit further includes at least one comparator circuit connected to the given bit line. The comparator circuit is operative to generate an output signal indicative of a logical state of a memory cell connected to the given bit line. The charge sharing circuit is operative to remove an amount of charge on the given bit line so as to reduce a voltage on the given bit line in conjunction with a read access of the memory cell.

In accordance with yet another aspect of the invention, accelerated sensing methodologies of the present invention may be implemented as embedded memory in an electronic device or alternative system.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of illustrative embodiments of a single-ended sensing circuit and memory circuits employing same. It should be understood, however, that the present invention is not limited to the particular circuit arrangements of the illustrative embodiments shown. Rather, the present invention provides techniques for advantageously improving the performance of a memory circuit, in at least one aspect, by using charge sharing to reduce the voltage on a charged bit line by a prescribed amount so as to allow a read signal developed on the bit line to more quickly reach a switching threshold of corresponding sensing circuitry coupled to the bit line. In this manner, an access time of the memory circuit is advantageously reduced, without significantly increasing the size of the memory circuit. The single-ended sensing arrangement formed in accordance with embodiments of the present invention is particularly well-suited for use in a wide variety of memory circuit applications, including, for example, ROM and REGFILE memory, although the invention is not limited to such applications.

Figure 1:
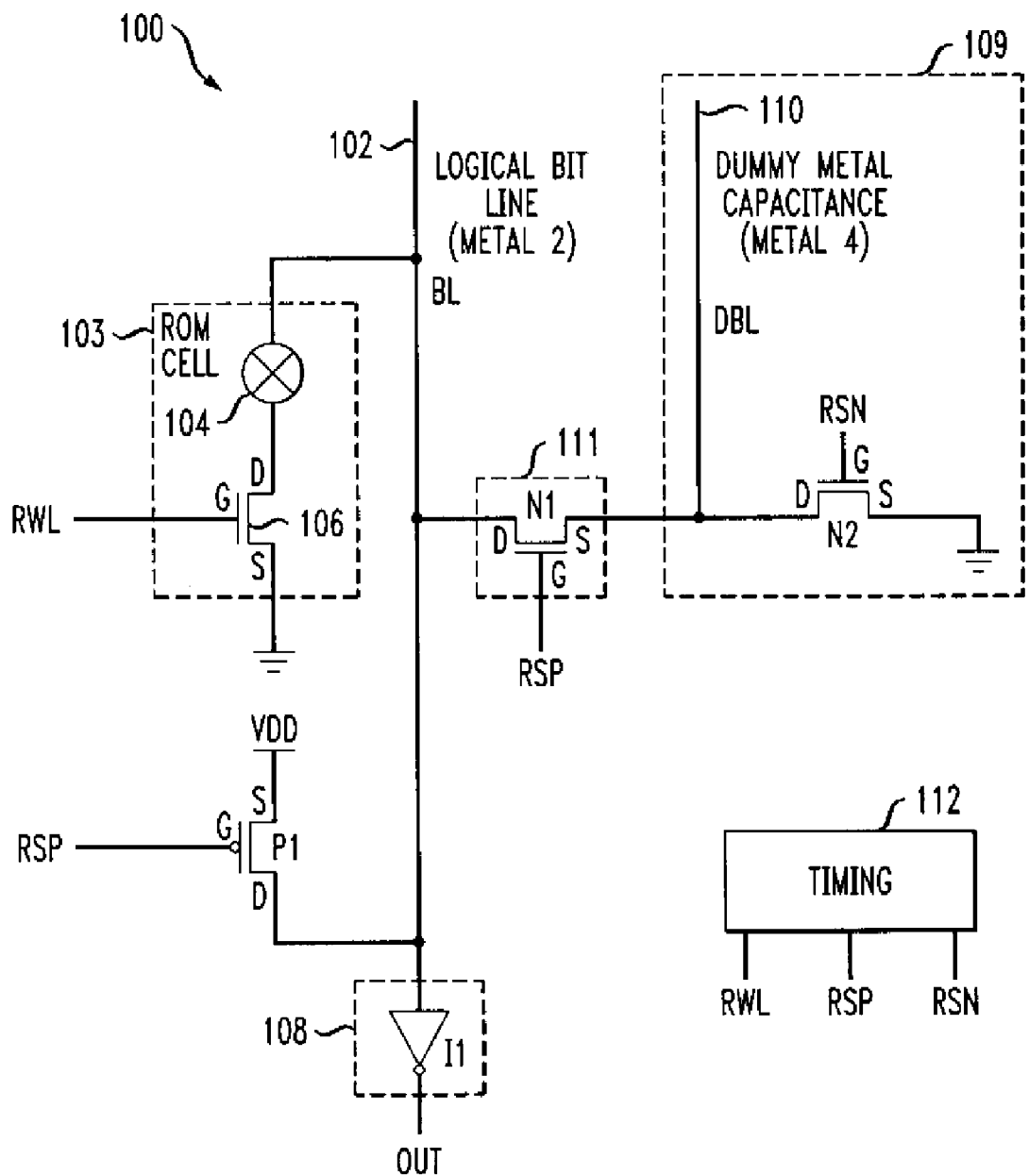
FIG. 1 is a schematic diagram depicting at least a portion of an exemplary ROM circuit in which sensing methodologies of the present invention are used, in accordance with one embodiment of the present invention.

FIG. 1 is a schematic diagram depicting at least a portion of an exemplary ROM circuit 100 in which the sensing methodologies of the present invention are used, in accordance with an embodiment of the invention. ROM circuit 100 may include a plurality of logical bit lines, of which only a single logical bit line 102 is shown for ease of explanation. ROM circuit 100 may further include a plurality of ROM cells coupled to the logical bit lines, of which a single ROM cell 103 is shown. ROM cell 103 preferably comprises a programmable via 104 and a corresponding access transistor 106, which may be an n-type field effect transistor (NFET). Programmable via 104 is either an open circuit or a closed circuit, depending on the logical state to be stored in the ROM cell 103. ROM cell 103 is connected to corresponding bit line 102. In a standard ROM circuit there may be many ROM cells (e.g., 512) connected to a given bit line. Specifically, a first end of the programmable via 104 is connected to bit line 102, a second end of the programmable via is connected to a drain (D) of access transistor 106, a source (S) of the access transistor is connected to a first voltage source, which may be ground, and a gate (G) of the access transistor is configured to receive a first control signal, RWL. Control signal RWL may be conveyed in ROM circuit 100 by a corresponding read word line (not shown).

It is to be appreciated that, because a field-effect transistor (FET) device is symmetrical in nature, and thus bi-directional, the assignment of source and drain designations in the FET device is essentially arbitrary. Therefore, the source and drain may be referred to herein generally as first and second source/drain, respectively, where "source/drain" in this context denotes a source or a drain.

Prior to a read access, bit line 102 in the ROM circuit 100 is preferably pre-charged to a prescribed voltage level, such as, for example, VDD, through a corresponding p-type field-effect transistor (PFET) pull-up device P1, or an alternative pre-charging arrangement. Specifically, a source of PFET device P1 is configured for connection to VDD, a drain of P1 is connected to bit line 102, and a gate of P1 is configured for receiving a second control signal, RSP. When signal RSP is low (e.g., zero volt), device P1 turns on, thereby charging bit line 102 substantially to VDD. A comparator circuit 108 is connected to corresponding bit line 102 and is operative to generate an output signal, OUT, which is indicative of a logical state of a selected ROM cell (e.g., ROM cell 103) connected to the bit line 102. Since only a subset of the plurality of bit lines in a memory circuit are generally utilized at any given time, comparator circuit 108 may be shared by a plurality of bit lines and selection circuitry (not shown) may be included in the memory circuit for connecting the comparator circuit to a selected one of the bit lines.

In a single-ended sensing application, comparator circuit 108 preferably comprises, for example, an inverter, I1, having an input coupled to corresponding bit line 102 and an output for generating signal OUT. In this instance, the signal developed on the bit line 102 is compared against a switching point of the inverter I1, which can be controlled as a function of the respective sizes (e.g., channel width to channel length ratio) of PFET and NFET devices in the inverter. Alternatively, when using a comparator circuit having differential inputs, the signal developed on the bit line 102 may be compared against a reference signal supplied to the comparator circuit 108. Although more complex in design, this arrangement may be advantageous when additional control over the switching threshold of the comparator circuit 108 is desired.

With bit line 102 pre-charged to a logic high level (e.g. "1"), signal OUT will be a logic low level (e.g., "0"). When a logic "0" is to be stored in ROM cell 103, programmable via 104 will be patterned as an open circuit. Therefore, bit line 102 will remain pre-charged high during the read access so that signal OUT will be a logic "0." Likewise, when a logic "1" is to be stored in ROM cell 103, programmable via 104 will be a patterned as a short circuit. Therefore, during the read access (e.g., signal RWL is a logic high level), bit line 102 will discharge to ground through programmable via 104 and access transistor 106. When the voltage on bit line 102 has decreased to a level below a switching threshold of comparator 108, which in this embodiment is equal to a switching point of inverter I1, signal OUT will switch to a logic high state.

As previously stated, in a standard memory circuit wherein many memory cells are coupled to a given bit line, the capacitance attributable to the memory cells can prevent the bit line from being discharged quickly. The time it takes for the memory cell to discharge the bit line to below the switching point of inverter I1 constitutes a significant part of the overall delay through the memory circuit. In accordance with aspects of the present invention, in order to reduce this delay, charge sharing is advantageously employed to decrease the voltage on a charged bit line by a prescribed amount prior to and/or during the read access. In this manner, the techniques of the invention can be beneficially used to increase the speed with which a valid output signal is generated by the memory circuit.

In order to implement this charge sharing approach, ROM circuit 100 further comprises a charge sharing circuit 109 including a dummy bit line 110 and an NFET device, N2, or other switching circuitry, connected to the dummy bit line. Alternative charge sharing circuit arrangements are similarly contemplated by the invention. NFET device N2 is operative to selectively connect the dummy bit line 110 to a voltage source, such as ground, so as to enable pre-charging of the dummy bit line to a prescribed voltage level prior to a read access. A source of NFET device N2 is preferably configured for connection to ground or an alternative voltage source, a drain of N2 is connected to the dummy bit line 110, and a gate of N2 is configured for receiving a third control signal, RSN. When signal RSN is active (e.g., VDD), NFET N2 turns on, thereby pre-charging dummy bit line 110 to ground.

Charge sharing circuit 109 is preferably connected to a given logical bit line 102 via a switching circuit 111, which may comprise an NFET device N1. A source of NFET device N1 is connected to dummy bit line 110, a drain of N1 is configured for connection to the given logical bit line 102, and a gate of N1 is configured for receiving a fourth control signal which, in this illustrative embodiment, is the same as the second control signal, namely, RSP. Thus, NFET N1 is activated when pre-charge PFET P1 turns off (e.g., signal RSP goes high). Alternatively, two separate control signals may be employed for the pre-charge PFET P1 and switching circuit 111. While logical bit line 102 and dummy bit line 110 are being pre-charged, NFET device N1 is disabled (e.g., turned off), thereby electrically isolating the charge sharing circuit 109 from the logical bit line. After the pre-charge device P1 is turned off, switching device N1 can be turned on to thereby connect charge sharing circuit 109 to the bit line 102. Although each logical bit line preferably includes a corresponding charge sharing circuit 109, only a subset of the plurality of logical bit lines in the memory circuit are selected at any given time. Therefore, a single charge sharing circuit 109 may be utilized by a plurality of logical bit lines, and switching circuit 111 may include a multiplexer, or alternative connection arrangement, operative to selectively connect the charge sharing circuit to an appropriate logical bit line.

Control signals RWL, RSP and RSN, as well as other signals used by ROM circuit 100, may be generated by a timing circuit 112 included in the ROM circuit. Alternatively, one or more of these control signals may be generated externally relative to the ROM circuit 100 and supplied to the ROM circuit. The generation of timing signals for use with a memory circuit is generally well known by those skilled in the art. Consequently, a detailed discussion of the timing circuit 112 will not be presented herein.

Charge sharing circuit 109, switching circuit 111 and comparator circuit 108 form a sensing circuit which is preferably included in ROM circuit 100. Alternatively, the sensing circuit formed in accordance with an illustrative embodiment of the invention may be used separately from the ROM circuit 100.

The amount of charge that is removed from the logical bit line 102 will be a function of a ratio of the capacitance of the logical bit line, $C_{BL}$, to the capacitance of the dummy bit line 110, $C_{DBL}$, but is also limited by NFET device N1 going into cutoff once the dummy bit line is charged to about VDD−Vt−$V_{body\ effect}$, where Vt is a threshold voltage of NFET N1 and $V_{body\ effect}$ is a body effect voltage of N1. The ratio of $C_{BL}$ to $C_{DBL}$ essentially controls how much the voltage on logical bit line 102 is initially reduced by charge sharing. Assuming, for example, that the dummy bit line 110 is configured having a capacitance that is substantially equal to the capacitance of corresponding bit line 102, then the most the voltage on logical bit line 102 will be initially reduced is about fifty percent. To retain at least some margin above the inverter switching point dummy bit line 10 can be configured to be slightly less capacitive than logical bit line 102. This can be achieved, for example, by adjusting a length, or alternative dimension, of dummy bit line 110 relative to logical bit line 102. Since this charge sharing methodology relies on a parasitic capacitance ratio, the resulting effect is substantially insensitive to semiconductor process variations. The charge sharing methodology also scales well with power supply voltage.

In an alternative embodiment, charge sharing circuit 109 may include a capacitor, or other capacitive element, configured having a prescribed capacitance associated therewith. The capacitor may be used in place of, or in addition to, dummy bit line 110. For example, a first terminal of the capacitor may be connected to the switching circuit 111 and a second terminal of the capacitor may be configured for connection to ground or an alternative voltage source. Since this arrangement does not rely on a parasitic capacitance ratio, it may be more sensitive to semiconductor process and/or voltage variations, but may provide other benefits, for example in terms of semiconductor area consumed.

It is to be understood that the desired switching point of inverter I1 in comparator circuit 108 will depend, at least in part, on acceptable noise margins for the memory circuit (e.g., ½ VDD, ⅔ VDD, etc.). The switching point of inverter I1 will, in turn, determine how much charge should be removed from the logical bit line 102. The desired amount of charge to be removed from the logical bit line 102 should be selected such that the voltage on the logical bit line is less than an initial pre-charge voltage (e.g., VDD) on the logical bit line and greater than the switching point of inverter I1, after allowing a sufficient margin for variations in semiconductor process, voltage and/or temperature (PVT) conditions to which the memory circuit may be subjected. If too much charge is removed from the logical bit line 102 as a result of the charge sharing circuit, the voltage on the logical bit line can drop below the switching threshold of the comparator circuit and thereby cause the memory circuit to generate an erroneous output signal.

In accordance with another aspect of the invention, the control signal supplied to switching circuit 111 is different than the control signal RSP supplied to PFET device P1. The timing of the control signal used to activate the switching circuit can be configured, relative to control signal RWL used to enable the ROM cell 103 for a read access, such that the charge sharing circuit 109 is disconnected from the logical bit line 102 during the read access (e.g., while RWL is high). Charge sharing circuit 109 is preferably connected to the bit line 102 for removing a prescribed amount of charge from the bit line, and then the charge sharing circuit can be subsequently disconnected from the bit line just before signal RWL goes high. In this manner, any capacitance associated with the charge sharing circuit 109 can be removed from the logical bit line 102 to allow the ROM cell 103 to more quickly discharge the bit line.

Figure 2:
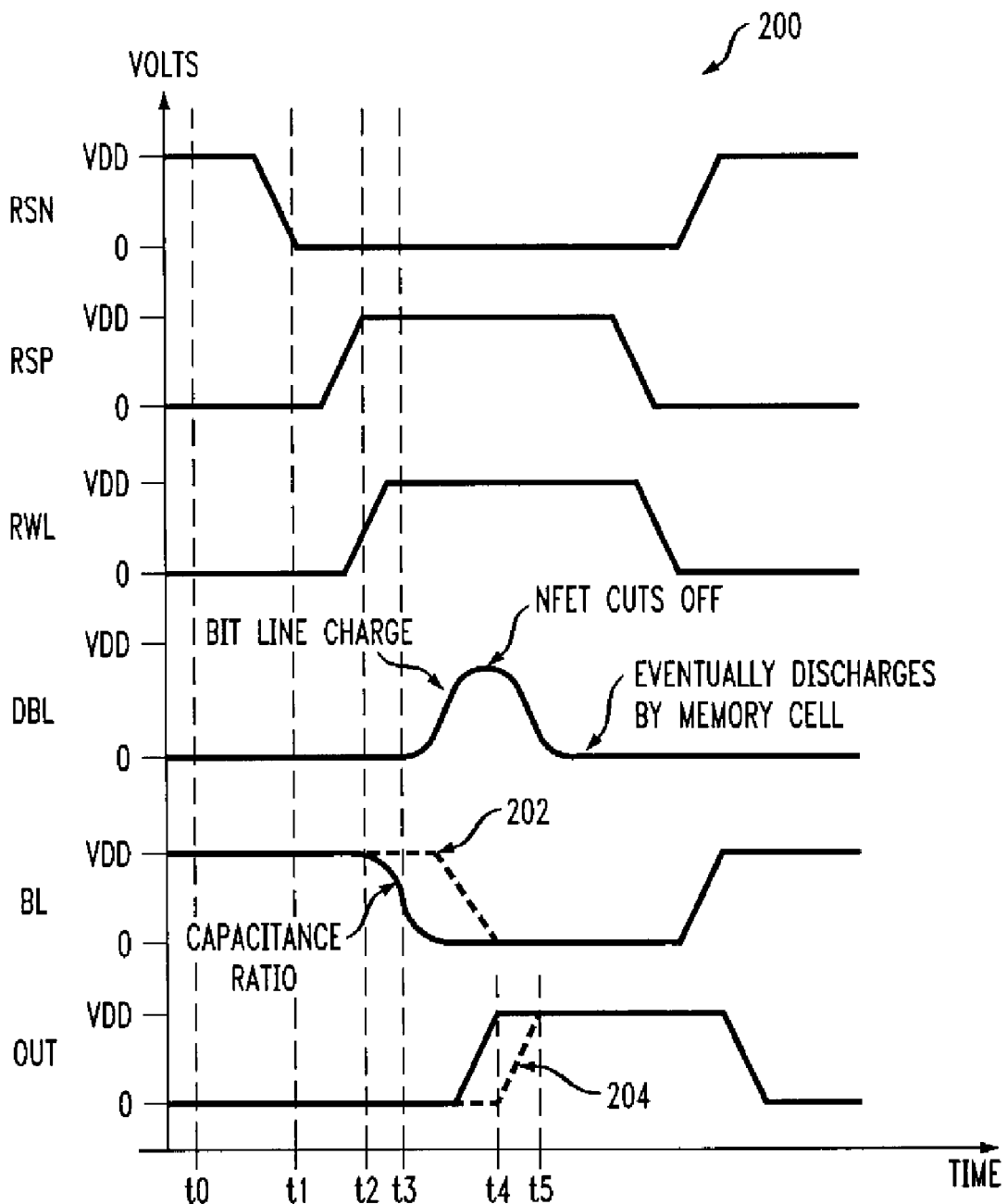
FIG. 2 is a logical timing diagram illustrating exemplary signals corresponding to the ROM circuit shown in FIG. 1, in accordance with an embodiment of the present invention.

FIG. 2 is a logical timing diagram 200 illustrating exemplary signals corresponding to the ROM circuit 100 shown in FIG. 1, in accordance with an embodiment of the invention. As apparent from the figure, at time t0, control signals RSP and RWL are low (e.g., 0) and RSN is high (e.g., VDD). Signal RSP being low turns on PFET device P1, thereby pre-charging logical bit line 102 high as indicated by logical bit line signal BL. Signal RSP being low also turns off NFET device N1, thereby isolating the logical bit line from the charge sharing circuit 109. Signal RSN being high turns on NFET device N2, thereby pre-charging dummy bit line 1110 low as indicated by dummy bit line signal DBL.

At time t1, signal RSN is low, thereby turning off NFET device N2 and allowing dummy bit line 110 to essentially float. At time t2, signal RSP is high, thereby turning off PFET device P1 and ending the pre-charging of logical bit line 102. Signal RSP being high also turns on NFET device N1, thereby connecting the charge sharing circuit to the logical bit line. Once the charge sharing circuit is connected to the logical bit line, some of the charge on logical bit line 102 will begin to be transferred to dummy bit line 110 in accordance with principles of conservation of charge. As previously explained, the amount of charge removed from the logical bit line will be a function of a ratio of the capacitance of the logical bit line to the capacitance of the charge sharing circuit (e.g., primarily the capacitance of the dummy bit line). Assuming the capacitances of the logical and dummy bit lines are substantially equal to one another, the amount of charge removed from the logical bit line and added to the dummy bit line will be about half of the initial charge on the logical bit line.

At time t3, signal RWL is high, thereby turning on the access transistor 106 in the ROM cell. If the ROM cell had a "0" stored therein, the ROM cell would be effectively isolated from the logical bit line and therefore would not discharge the bit line. In the present illustration, the ROM cell is assumed to have a "1" stored therein. Accordingly, when signal RWL goes high, the ROM cell begins discharging the logical bit line to ground. However, since some charge has already been removed from the logical bit line as a result of the charge sharing circuit, the amount of time required to discharge the bit line to below the switching threshold of the comparator circuit 108 is significantly reduced compared to a standard memory circuit. Without the charge sharing circuit, the logical bit line voltage BL does not begin to decrease until after the ROM cell has been accessed (e.g., after time t3), as indicated by 202. Once the voltage BL on the logical bit line drops below the switching threshold of the comparator circuit 108, the output signal OUT generated by the comparator circuit goes high at time t4. Time t5 indicates the point at which the output signal OUT goes high following trace 204, which represents the ROM circuit performance without the charge sharing circuit. The difference between times t5 and t4, namely, t5-t4, represents the reduction in delay time of the ROM circuit attributable to the charge sharing circuit.

As stated above, if too much charge is removed from the logical bit line as a result of the charge sharing circuit, the voltage on the logical bit line can drop below the switching threshold of the comparator circuit and thereby cause the ROM circuit to generate an erroneous output signal. As apparent from the figure, the amount of charge transferred to the dummy bit line from the logical bit line will effectively be limited by the cutoff of NFET device N1 in switching circuit 111. Specifically, since the gate voltage of device N1 is VDD, as the voltage DBL on the dummy bit line rises to about a threshold voltage plus a body effect voltage of N1 below VDD, device N1 will begin to cut off. This cutoff effect of the NFET device provides a self-limiting mechanism to beneficially prevent too much charge from being bleed off the logical bit line.

Figure 3:
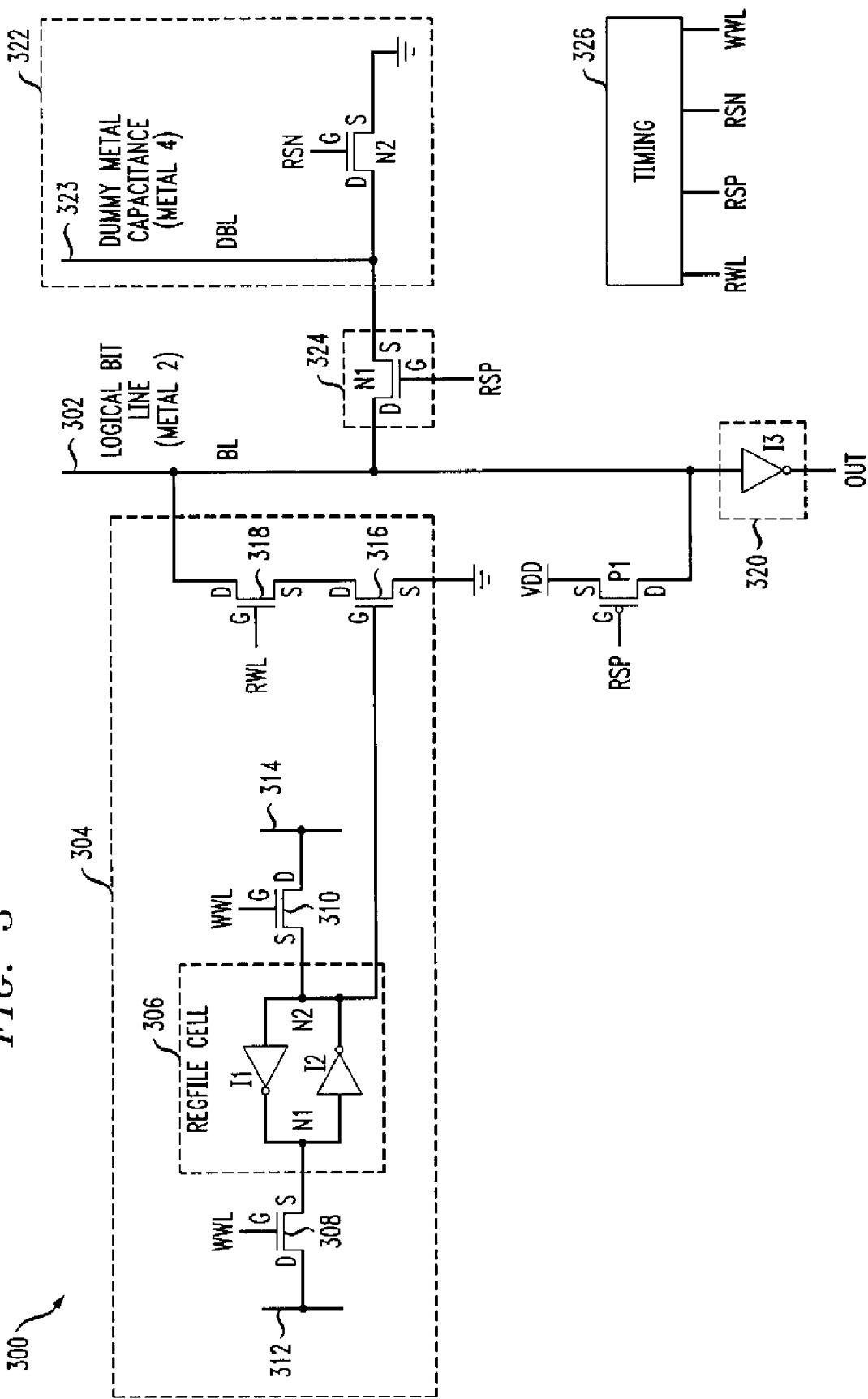
FIG. 3 is a schematic diagram depicting at least a portion of an exemplary REGFILE memory circuit in which sensing methodologies of the present invention are used, in accordance with another embodiment of the invention.

FIG. 3 is a schematic diagram depicting at least a portion of an exemplary REGFILE memory circuit 300 in which the sensing methodologies of the present invention are used, in accordance with another embodiment of the invention. As will become apparent from the figure, the single-ended sensing techniques of the present invention as used in conjunction with a REGFILE memory circuit are substantially the same as in the ROM circuit application depicted in FIG. 1.

REGFILE memory circuit 300 may include a plurality of logical bit lines, of which only a single logical bit line 302 is shown for ease of explanation. REGFILE memory circuit 300 may further include a plurality of REGFILE memory cells coupled to the logical bit lines, of which a single REGFILE memory cell 304 is shown. REGFILE memory cell 304 preferably comprises a storage element 306 for storing a logical state of the memory cell. The storage element 306 preferably includes a pair of inverters, I1 and I2, connected such that an output of one inverter is connected to an input of the other inverter. Specifically, the output of inverter I1 is connected to the input of inverter I2 at node N1, and the output of inverter I2 is connected to the input of inverter I1 at node N2. The storage element 306 is selectively connected to a pair of write bit lines, 312 and 314, via a pair of corresponding NFET devices, 308 and 310 respectively. Data to be stored in the memory cell 304 is preferably conveyed via the write bit lines 312, 314. A source of device 308 is connected to the storage element 306 at node N1, a drain of device 308 is configured for connection to bit line 312, and a gate of device 308 is configured for receiving a first control signal, WWL. Likewise, a source of device 310 is connected to the storage element 306 at node N2, a drain of device 310 is configured for connection to bit line 314, and a gate of device 310 is configured for receiving the first control signal WWL.

An output of the storage element 306 at node N2, although the output may similarly be generated at node N1, is preferably connected to a first NFET access transistor 316. A second NFET access transistor 318 is connected between first access transistor 316 and corresponding logical bit line 302. Specifically, a drain of NFET 318 is configured for connection to bit line 302, a gate of NFET 318 is configured for receiving a second control signal, RWL, a source of NFET 318 is connected to a drain of NFET 316, a gate of NFET 316 is connected to the storage element 306 at node N2, and a source of NFET 316 is configured for connection to ground, or an alternative voltage source. Control signal RWL may be conveyed by a corresponding read word line (not shown) in REGFILE memory circuit 300. When signal RWL is high, access NFET 318 turns on. When a logic "1" is stored in storage element 306, access NFET 316 will be turned on, thereby discharging bit line 302 to ground. Likewise, when a logic "0" is stored in storage element 306, NFET 316 will be turned off, thereby effectively isolating the memory cell 304 from the logical bit line 302. Although only a single memory cell is shown connected to the bit line, in a standard REGFILE memory circuit there are typically many memory cells (e.g., 512) connected to a given bit line.

Prior to a read access, logical bit line 302 in the REGFILE memory circuit 300 is preferably pre-charged to a prescribed voltage level, such as, for example, VDD, through a corresponding PFET pull-up device P1, or an alternative pre-charging arrangement. Specifically, a source of PFET device P1 is configured for connection to VDD, a drain of P1 is connected to bit line 302, and a gate of P1 is configured for receiving a third control signal, RSP. When signal RSP is low, device P1 turns on, thereby charging bit line 302 substantially to VDD. A comparator circuit 320 is connected to corresponding bit line 302 and is operative to generate an output signal, OUT, which is indicative of a logical state of a selected memory cell (e.g., memory cell 304) connected to the bit line 302. As previously stated, since only a subset of the plurality of bit lines in a memory circuit are generally utilized at any given time, comparator circuit 320 may be shared by a plurality of bit lines and selection circuitry (not shown) may be included in the memory circuit for connecting the comparator circuit to a selected one of the bit lines.

Comparator circuit 320 preferably comprises, for example, an inverter, I3, having an input coupled to corresponding bit line 302 and an output for generating signal OUT. In this instance, the signal developed on the bit line 302 is compared against a switching point of inverter I3, which can be controlled as a function of the respective sizes (e.g., channel width to channel length ratio) of PFET and NFET devices in the inverter. Alternatively, a comparator circuit having differential inputs for comparing the signal developed on the bit line 302 to a reference signal supplied to the comparator circuit 320 may be employed.

With bit line 302 pre-charged to a logic high level (e.g. "1"), signal OUT will be a logic low level (e.g., "0"). When a logic "0" is stored in memory cell 304, logical bit line 302 will remain pre-charged high during the read access so that signal OUT will be a logic "0." Likewise, when a logic "1" is stored in memory cell 304, bit line 302 will discharge to ground through access transistors 316 and 318. When the voltage on bit line 302 has decreased to a level below a switching threshold of comparator 320, which in this embodiment is equal to a switching point of inverter I3, signal OUT will switch to a logic high state.

Like the illustrative ROM circuit 100 depicted in FIG. 1, REGFILE memory circuit 300 further comprises a charge sharing circuit 322 including a dummy bit line 323 and an NFET device, N2, connected to the dummy bit line. Charge sharing circuit 322 preferably functions in a manner consistent with the charge sharing circuit 109 shown in FIG. 1 and described herein above, although alternative charge sharing circuit arrangements are similarly contemplated by the invention. Device N2 is operative to connect the dummy bit line 323 to a voltage source, such as, to for example, ground, so as to enable pre-charging of the dummy bit line to a prescribed voltage level prior to a read access. A source of device N2 is preferably configured for connection to ground or an alternative voltage source, a drain of N2 is connected to dummy bit line 323, and a gate of N2 is configured for receiving a fourth control signal, RSN. When signal RSN is active (e.g., VDD), device N2 turns on, thereby pre-charging dummy bit line 323 to ground.

Charge sharing circuit 322 is connected to a given logical bit line 302 via a switching circuit 324, which preferably comprises an NFET device N1. A source of device N1 is connected to dummy bit line 323, a drain of N1 is configured for connection to logical bit line 302, and a gate of N1 is configured for receiving a fifth control signal which, in this illustrative embodiment, is the same as the third control signal, namely, RSP. Thus, device N1 is activated when pre-charge device P1 turns off (e.g., signal RSP goes high). Alternatively, two separate control signals may be employed for the pre-charge device P1 and switching circuit 324. While logical bit line 302 and dummy bit line 323 are being pre-charged, device N1 is disabled, thereby electrically isolating the charge sharing circuit 322 from the logical bit line. After device P1 is turned off, device N1 can be turned on to thereby connect charge sharing circuit 322 to logical bit line 302. Although each logical bit line preferably includes a corresponding charge sharing circuit 322, a single charge sharing circuit may be utilized by a plurality of logical bit lines, and switching circuit 324 may include a multiplexer, or alternative connection arrangement, operative to selectively connect the charge sharing circuit to an appropriate logical bit line.

Control signals RWL, RSP, RSN and WWL, as well as other signals used by REGFILE memory circuit 300, may be generated by a timing circuit 326 included in the REGFILE memory circuit. Alternatively, one or more of these control signals may be generated externally relative to the REGFILE memory circuit 300 and supplied to the REGFILE memory circuit. The generation of timing signals for use with a memory circuit is generally well known by those skilled in the art. Consequently, a detailed discussion of the timing circuit 326 will not be presented herein.

The sensing methodologies of embodiments of the invention may be particularly well-suited for use in a memory embedded in an electronic device or alternative system. For example, an illustrative electronic device formed in accordance with another aspect of the invention may include a microprocessor, or alternative processing device (e.g., digital signal processor, microcontroller, central processor unit, etc.), memory coupled to the microprocessor (e.g., via a bus or alternative connection means), as well as input/output circuitry operative to interface with the microprocessor (e.g., for presenting data to the microprocessor and/or for obtaining data from the microprocessor). In various embodiments, the single-ended sensing circuit of the present invention can be included within many storage application areas within the electronic device.

At least a portion of the apparatus and methodologies of the present invention may be implemented in one or more integrated circuits. In forming integrated circuits, a plurality of identical die is typically fabricated in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A single-ended sensing circuit for use with a memory circuit including a plurality of logical bit lines and a plurality of memory cells connected to the logical bit lines, the sensing circuit comprising:
   at least one charge sharing circuit;
   at least one switching circuit connected to the at least one charge sharing circuit and being operative to selectively connect the charge sharing circuit to at least a given one of the logical bit lines as a function of a first control signal supplied to the at least one switching circuit; and
   at least one comparator circuit connected to the given logical bit line, the comparator circuit being operative to generate an output signal indicative of a logical state of a memory cell connected to the given logical bit line;
   wherein the charge sharing circuit is operative to remove an amount of charge on the given logical bit line so as to reduce a voltage on the given logical bit line in conjunction with a read access of the memory cell.

2. The sensing circuit of claim 1, wherein the at least one charge sharing circuit comprises:
   at least one dummy bit line; and
   a second switching circuit connected to the at least one dummy bit line and being operative to selectively connect the at least one dummy bit line to a first voltage source as a function of a second control signal.

3. The sensing circuit of claim 1, wherein the at least one charge sharing circuit comprises:
   a capacitor; and
   a second switching circuit connected to the capacitor and being operative to selectively connect the capacitor to a first voltage source as a function of a second control signal.

4. The sensing circuit of claim 1, wherein the comparator circuit comprises an inverter including an input for connection to the corresponding logical bit line and an output for generating the output signal.

5. The sensing circuit of claim 1, wherein the charging sharing circuit is configured to reduce the voltage on the logical bit line to less than an initial pre-charge voltage level on the logical bit line and greater than a switching threshold of the at least one comparator circuit.

6. The sensing circuit of claim 1, wherein the switching circuit comprises a field-effect transistor device including a first source/drain connected to the charge sharing circuit, a second source/drain configured for connection to the corresponding logical bit line, and a gate configured for receiving the first control signal.

7. The sensing circuit of claim 1, further comprising a pre-charge circuit configured for connection to the corresponding logical bit line and being operative to selectively charge the corresponding logical bit line to the first voltage level prior to a read access of the memory cell.

8. The sensing circuit of claim 1, wherein the memory cell comprises a read-only memory cell.

9. The sensing circuit of claim 1, wherein the memory cell comprises a register file memory cell.

10. The sensing circuit of claim 1, further comprising a timing circuit operative to generate at least the first control signal.

11. The sensing circuit of claim 1, wherein the given bit line is initially charged to a first voltage level.

12. The sensing circuit of claim 1, wherein the charge sharing circuit is operative to remove a prescribed amount of charge on the given logical bit line so as to reduce a voltage on the given logical bit line prior to a read access of the memory cell.

13. The sensing circuit of claim 1, wherein the charge sharing circuit is operative to remove a prescribed amount of charge on the given logical bit line so as to reduce a voltage on the given logical bit line during a read access of the memory cell.

14. The sensing circuit of claim 2, wherein the at least one dummy bit line is configured such that a capacitance of the at least one dummy bit line is substantially equal to a capacitance of the corresponding logical bit line.

15. The sensing circuit of claim 3, wherein a capacitance of the capacitor is substantially equal to a capacitance of the corresponding logical bit line.

16. The sensing circuit of claim 7, wherein the pre-charge circuit comprises a field-effect transistor device including a first source/drain configured for connection to a first voltage source having the first voltage level, a second source/drain configured for connection to the corresponding logical bit line, and a gate configured for receiving a second control signal.

17. A memory circuit, comprising:
a plurality of logical bit lines;
a plurality of memory cells connected to the logical bit lines; and
at least one single-ended sensing circuit, the at least one single-ended sensing circuit comprising:
at least one charge sharing circuit;
at least one switching circuit connected to the at least one charge sharing circuit and being operative to selectively connect the charge sharing circuit to at least a given one of the logical bit lines as a function of a first control signal supplied to the at least one switching circuit; and
at least one comparator circuit connected to the given logical bit line, the comparator circuit being operative to generate an output signal indicative of a logical state of a memory cell connected to the corresponding logical bit line;
wherein the charge sharing circuit is operative to remove an amount of charge on the given logical bit line so as to reduce a voltage on the given logical bit line in conjunction with a read access of the memory cell.

18. The memory circuit of claim 17, wherein the memory circuit comprises a read-only memory.

19. The memory circuit of claim 17, wherein the memory circuit comprises a register file memory.

20. An integrated circuit including at least one single-ended sensing circuit for use with a memory circuit including a plurality of bit lines and a plurality of memory cells connected to the bit lines, the at least one sensing circuit comprising:

charge sharing circuitry;
switching circuitry connected to the charge sharing circuitry and being operative to selectively connect the charge sharing circuitry to at least a given one of the bit lines as a function of a first control signal supplied to the switching circuitry; and
at least one comparator connected to the given bit line, the comparator being operative to generate an output signal indicative of a logical state of a memory cell connected to the given bit line;
wherein the charge sharing circuitry is operative to remove an amount of charge on the given bit line so as to reduce a voltage on the given bit line in conjunction with a read access of the memory cell.

21. An integrated circuit including at least one memory circuit, the at least one memory circuit comprising:
a plurality of bit lines;
a plurality of memory cells connected to the bit lines; and
at least one single-ended sensing circuit, the at least one single-ended sensing circuit comprising:
charge sharing circuitry;
switching circuitry connected to the charge sharing circuitry and being operative to selectively connect the charge sharing circuitry to at least a given one of the bit lines as a function of a first control signal supplied to the switching circuitry; and
at least one comparator connected to the given bit line, the comparator being operative to generate an output signal indicative of a logical state of a memory cell connected to the given bit line;
wherein the charge sharing circuitry is operative to remove an amount of charge on the given bit line so as to reduce a voltage on the given bit line in conjunction with a read access of the memory cell.

22. A system including an embedded memory, the embedded memory comprising:
a plurality of bit lines;
a plurality of memory cells connected to the bit lines; and
at least one single-ended sensing circuit, the at least one single-ended sensing circuit comprising:
at least one charge sharing circuit;
at least one switching circuit connected to the at least one charge sharing circuit and being operative to selectively connect the charge sharing circuit to at least a given one of the bit lines as a function of a first control signal supplied to the at least one switching circuit; and
at least one comparator circuit connected to the given bit line, the comparator circuit being operative to generate an output signal indicative of a logical state of a memory cell connected to the corresponding bit line;
wherein the charge sharing circuit is operative to remove an amount of charge on the given bit line so as to reduce a voltage on the given bit line in conjunction with a read access of the memory cell.

* * * * *